United States Patent
Gupta et al.

(10) Patent No.: US 11,449,088 B2
(45) Date of Patent: Sep. 20, 2022

(54) BANDGAP REFERENCE VOLTAGE GENERATOR WITH FEEDBACK CIRCUITRY

(71) Applicant: NXP B.V., Eindhoven (NL)

(72) Inventors: Sushil Kumar Gupta, Bangalore (IN); Mukul Pancholi, Jaipur (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/248,849

(22) Filed: Feb. 10, 2021

(65) Prior Publication Data

US 2022/0253087 A1 Aug. 11, 2022

(51) Int. Cl.
*G05F 3/26* (2006.01)
*G05F 1/46* (2006.01)
*G05F 1/575* (2006.01)

(52) U.S. Cl.
CPC .............. *G05F 3/267* (2013.01); *G05F 1/461* (2013.01); *G05F 1/468* (2013.01); *G05F 1/575* (2013.01)

(58) Field of Classification Search
CPC .......... G05F 3/267; G05F 1/461; G05F 1/468; G05F 1/575
See application file for complete search history.

(56) References Cited

U.S. PATENT DOCUMENTS

| | | | |
|---|---|---|---|
| 6,570,437 B2 | 5/2003 | Park et al. | |
| 8,085,029 B2 * | 12/2011 | Dobkin | G05F 3/30 323/314 |
| 10,061,340 B1 | 8/2018 | Rao et al. | |
| 10,712,763 B2 | 7/2020 | Mouret et al. | |
| 10,890,935 B2 | 1/2021 | Mouret et al. | |
| 2017/0220058 A1 * | 8/2017 | Petenyi | G05F 1/575 |
| 2018/0017986 A1 * | 1/2018 | Lahiri | G05F 3/262 |
| 2018/0096712 A1 * | 4/2018 | Yang | G06F 21/81 |
| 2018/0210480 A1 * | 7/2018 | Sone | G05F 3/267 |

OTHER PUBLICATIONS

A. Paul Brokaw, "A Simple Three-Terminal IC Bandgap Reference", IIEEE Journal of Solid-State Circuits, Dec. 1974, pp. 388-393, vol. 9, Issue. 6, IEEE.
J.S. Brugler, "Silicon Transistor Biasing for Linear Collector Current Temperature Dependence", IEEE Journal of Solid-State Circuits, Jun. 1967, pp. 57-58, vol. 2, Issue. 2, IEEE.
Brokaw, A. P. "How to Make a Bandgap Voltage Reference in One Easy Lesson", A Paul Brokaw and Integrated Device Technology, 60 pgs., retreived from the internet Feb. 10, 2021 at: https://www.renesas.com/us/en/document/whp/how-make-bandgap-voltage-reference-one-easy-lesson-paul-brokaw (2011).

* cited by examiner

*Primary Examiner* — Kyle J Moody
*Assistant Examiner* — Lakaisha Jackson

(57) ABSTRACT

A bandgap reference voltage generator can include a bandgap core circuit configured to output at least one control voltage. The bandgap reference voltage generator can further include feedback circuitry that can be configured to receive a control voltage outputted by the bandgap core circuit or another control voltage generated based on the control voltage, and output a current. The current can be outputted such that the current is sourced to or sank from the bandgap core circuit. The feedback circuitry can be further configured to generate a bandgap reference voltage. When the current is sourced to the bandgap core circuit, the bandgap reference voltage can be greater than a threshold value. Similarly, when the current is sank from the bandgap core circuit, the bandgap reference voltage can be less than the threshold value.

18 Claims, 7 Drawing Sheets

BANDGAP REFERENCE VOLTAGE GENERATOR WITH FEEDBACK CIRCUITRY

BACKGROUND

The present disclosure relates generally to electronic circuits, and, more particularly, to a bandgap reference voltage generator.

System-on-chips (SoC) include various bandgap reference voltage generators that generate bandgap reference voltages. The generated bandgap reference voltages are utilized by various functional components (e.g., analog-to-digital converters, low-dropout regulators, or the like) of the SoC for executing various functional operations associated therewith. Typically, a bandgap reference voltage generator includes a current mirror circuit, a bandgap core circuit, and feedback circuitry coupled in a negative feedback loop with the bandgap core circuit. The bandgap core circuit includes bipolar transistors and various resistors, whereas the feedback circuitry includes a metal-oxide-semiconductor transistor. A bandgap reference voltage generated by such a bandgap reference voltage generator has a fixed voltage level (e.g., 1.2345 volts (V)) and is temperature-independent.

An SoC may however operate in various operating voltages, and hence, the functional components of the SoC may require bandgap reference voltages of different voltage levels (i.e., voltage levels other than 1.2345 V). To generate such bandgap reference voltages, the bandgap reference voltage generator utilizes additional circuits in conjunction with the feedback circuitry. Typically, such circuits include a series of resistors, bipolar transistors, current summing circuits, or a combination thereof. Utilization of such circuits results in a significant base current being generated in the bipolar transistors of the bandgap core circuit. Hence, various current compensation circuits are required to be implemented in the bandgap reference voltage generator to compensate for the generated base currents. As a result, a power supply rejection ratio of the bandgap reference voltage generator degrades, the bandgap reference voltage generator consumes high power, and a size and a manufacturing cost of the bandgap reference voltage generator increase. Therefore, there exists a need for a technical solution that solves the aforementioned problems of existing bandgap reference voltage generators.

SUMMARY

In an embodiment of the present disclosure, a bandgap reference voltage generator is disclosed. The bandgap reference voltage generator can include a bandgap core circuit that can be configured to output first and second control voltages. The bandgap reference voltage generator can further include feedback circuitry that can be coupled with the bandgap core circuit. The feedback circuitry can include a current replica circuit that can be coupled with the bandgap core circuit, and configured to receive a supply voltage and a third control voltage that is generated based on the first and second control voltages, and output first and second currents. The current replica circuit can output the second current such that the second current is sourced to the bandgap core circuit. The bandgap core circuit can output the first and second control voltages based on the second current. The feedback circuitry can further include a first resistor that can be coupled with the current replica circuit, and configured to receive the first current and generate a bandgap reference voltage.

In some embodiments, the bandgap core circuit can include first and second transistors each having first through third terminals. The first terminals of the first and second transistors can be configured to receive third and fourth currents, and output the first and second control voltages, respectively, and the second terminals of the first and second transistors can be coupled with the first resistor, and configured to receive the bandgap reference voltage. A size of the first transistor can be greater than a size of the second transistor. The bandgap core circuit can further include second and third resistors. The second resistor can be coupled with the third terminals of the first and second transistors, and configured to receive the third and fourth currents, respectively. The third resistor can be coupled between the second resistor and a ground terminal, and configured to receive a fifth current and generate an intermediate voltage.

In some embodiments, the bandgap reference voltage is equal to a sum of the intermediate voltage and a base-emitter voltage associated with the second transistor. The current replica circuit can be coupled with the second resistor, and output the second current such that the second current is sourced to the second resistor. The first terminals of the first and second transistors can further output the first and second control voltages based on the second current. The fifth current is equal to a sum of the second through fourth currents.

In some embodiments, the bandgap reference voltage generator can further include a current mirror circuit that can be configured to receive the supply voltage and output the third and fourth currents.

In some embodiments, the current replica circuit can include third and fourth transistors having first terminals that can be configured to receive the supply voltage, second terminals that can be configured to receive the third control voltage, and third terminals that can be configured to output the first and second currents, respectively. The third terminal of the second transistor can be coupled with the second resistor, and output the second current such that the second current is sourced to the second resistor.

In some embodiments, the bandgap reference voltage generator can further include an amplifier that can be coupled with the first terminals of the first and second transistors and the second terminals of the third and fourth transistors. The amplifier can be configured to receive the first and second control voltages from the first terminals of the first and second transistors, respectively, and generate and provide the third control voltage to the second terminals of the third and fourth transistors. The third control voltage is greater than a difference between the first and second control voltages.

In another embodiment of the present disclosure, a bandgap reference voltage generator is disclosed. The bandgap reference voltage generator can include a bandgap core circuit that can be configured to output first and second control voltages, and feedback circuitry that can be coupled with the bandgap core circuit. The feedback circuitry can include a current replica circuit, a first current mirror circuit, and a first resistor. The current replica circuit can be configured to receive a supply voltage and a third control voltage that is generated based on the first and second control voltages, and output first and second currents. The first current mirror circuit can be coupled with the current replica circuit and the bandgap core circuit, and configured to receive the second current and output a third current such that the third current is sank from the bandgap core circuit. The bandgap core circuit can output the first and second control voltages based on the third current. The first resistor can be coupled with the current replica circuit, and configured to receive the first current and generate a bandgap reference voltage.

In some embodiments, the bandgap core circuit can include first and second transistors each having first through third terminals. The first terminals of the first and second transistors can be configured to receive fourth and fifth currents, and output the first and second control voltages, respectively. Further, the second terminals of the first and second transistors can be coupled with the first resistor, and configured to receive the bandgap reference voltage. A size of the first transistor can be greater than a size of the second transistor. The bandgap core circuit can further include second and third resistors. The second can be coupled with the third terminals of the first and second transistors, and configured to receive the fourth and fifth currents, respectively. The third resistor can be coupled between the second resistor and a ground terminal, and configured to receive a sixth current and generate an intermediate voltage.

In some embodiments, the bandgap reference voltage is equal to a sum of the intermediate voltage and a base-emitter voltage associated with the second transistor. The first current mirror circuit can be coupled with the second resistor, and output the third current such that the third current can be sank from the second resistor. The first terminals of the first and second transistors can further output the first and second control voltages based on the third current. The sixth current is equal to a difference between the third current and a sum of the fourth and fifth currents.

In some embodiments, the bandgap reference voltage generator can further include a second current mirror circuit that can be configured to receive the supply voltage and output the fourth and fifth currents.

In some embodiments, the current replica circuit can include third and fourth transistors having first terminals that can be configured to receive the supply voltage, second terminals that can be configured to receive the third control voltage, and third terminals that can be configured to output the first and second currents, respectively.

In some embodiments, the bandgap reference voltage generator can further include an amplifier that can be coupled with the first terminals of the first and second transistors and the second terminals of the third and fourth transistors. The amplifier can be configured to receive the first and second control voltages from the first terminals of the first and second transistors, respectively, and generate and provide the third control voltage to the second terminals of the third and fourth transistors. The third control voltage is greater than a difference between the first and second control voltages.

In some embodiments, the first current mirror circuit can include fifth and sixth transistors that have first terminals coupled with the ground terminal and second terminals coupled with each other. The fifth transistor further has a third terminal that can be coupled with the second terminals of the fifth and sixth transistors and the third terminal of the fourth transistor, and configured to receive the second current. The sixth transistor further has a third terminal that can be coupled with the second resistor, and configured to output the third current such that the third current is sank from the second resistor.

In yet another embodiment of the present disclosure, a bandgap reference voltage generator is disclosed. The bandgap reference voltage generator can include a bandgap core circuit that can be configured to output a first control voltage, and feedback circuitry that can be coupled with the bandgap core circuit. The feedback circuitry can include a first transistor and a first resistor. The first transistor has a first terminal that can be configured to receive a supply voltage, a second terminal that can be configured to receive one of the first control voltage and a second control voltage, and a third terminal that can be configured to output a first current. The second control voltage is generated based on the first control voltage. The first resistor can be coupled with the bandgap core circuit and the third terminal of the first transistor, and configured to receive one of the first current and a second current that is generated based on the first current, and generate a bandgap reference voltage.

In some embodiments, the bandgap core circuit can include second and third transistors each having first through third terminals. The first terminals of the second and third transistors can be configured to receive third and fourth currents, respectively, and the second terminals of the second and third transistors can be coupled with the first resistor, and configured to receive the bandgap reference voltage. A size of the second transistor can be greater than a size of the third transistor. The bandgap core circuit can further include second and third resistors. The second resistor can be coupled with the third terminals of the second and third transistors, and configured to receive the third and fourth currents, respectively. The second resistor can be further coupled with the first resistor, and configured to receive a fifth current. The first terminal of the third transistor can be further configured to output the first control voltage based on the fourth and fifth currents. The third resistor can be coupled between the second resistor and the ground terminal, and configured to receive a sixth current and generate an intermediate voltage. The sixth current is equal to a sum of the third through fifth currents.

In some embodiments, the bandgap reference voltage is equal to a sum of the intermediate voltage and a base-emitter voltage associated with the third transistor.

In some embodiments, the feedback circuitry can further include fourth through sixth transistors each having first through third terminals. The first terminal of the fourth transistor can be configured to receive the supply voltage and the third terminal of the fourth transistor can be configured to output a seventh current. The first terminal of the fifth transistor can be coupled with the ground terminal and the third terminal of the fifth transistor can be coupled with the third terminal of the fourth transistor, and configured to receive the seventh current. The first terminal of the sixth transistor can be coupled with the ground terminal, and the second terminal of the sixth transistor can be coupled with the second terminal of the fifth transistor. Further, the third terminal of the sixth transistor can be coupled with the third terminal of the first transistor and the first resistor, and configured to output an eighth current such that the eighth current is sank from the first resistor. The second current is equal to a difference between the first and eighth currents.

In some embodiments, the bandgap reference voltage generator can further include a current mirror circuit that can be coupled with the second terminal of the fourth transistor, and configured to receive the supply voltage and output the third and fourth currents.

In some embodiments, the first terminal of the third transistor can be further coupled with the second terminal of the first transistor, and further configured to provide the first control voltage to the second terminal of the first transistor. The first current can be outputted based on the first control voltage.

In some embodiments, the bandgap reference voltage generator can further include an amplifier that can be coupled with the first terminals of the second and third transistors and the second terminal of the first transistor. The first terminal of the second transistor can be further configured to output a third control voltage based on the third and fifth currents. The amplifier can be configured to receive the first and third control voltages from the first terminals of the third and second transistors, respectively, and generate and provide the second control voltage to the second terminal of the first transistor. The second control voltage can be greater than a difference between the first and third control voltages. The first current can be outputted based on the second control voltage.

Various embodiments of the present disclosure disclose a bandgap reference voltage generator. The bandgap reference voltage generator can include a bandgap core circuit that can be configured to output at least one control voltage. The bandgap reference voltage generator can further include feedback circuitry that can be coupled with the bandgap core circuit in a feedback loop, and configured to receive a control voltage outputted by the bandgap core circuit or another control voltage that is generated based on the control voltage, and output a current. The current can be outputted such that the current is sourced to the bandgap core circuit or sank from the bandgap core circuit. The feedback circuitry can be further configured to generate the bandgap reference voltage. When the current is sourced to the bandgap core circuit, the bandgap reference voltage can be greater than a threshold value. Similarly, when the current is sank from the bandgap core circuit, the bandgap reference voltage can be less than the threshold value. The threshold value corresponds to a bandgap reference voltage at 0 kelvin (K).

Thus, the bandgap reference voltage generator of the present disclosure generates the bandgap reference voltage having voltage levels greater than as well as less than the bandgap reference voltage at 0 K. Such a bandgap reference voltage can be generated by utilizing exclusively the feedback circuitry and sans any additional circuits (i.e., circuits that are not included in the feedback loop of the bandgap core circuit). As a result, generation of significant base currents in bipolar transistors of the bandgap core circuit is eliminated, thereby eliminating a need to implement current compensation circuits in the bandgap reference voltage generator of the present disclosure. Thus, a power supply rejection ratio of the bandgap reference voltage generator of the present disclosure is greater than that of a conventional bandgap reference voltage generator that has significant base currents being generated in bipolar transistors of a corresponding bandgap core circuit, and hence, is required to implement various current compensation circuits therein. Further, a size and a manufacturing cost of the bandgap reference voltage generator of the present disclosure are significantly less than that of the conventional bandgap reference voltage generator. Additionally, a power consumed by the bandgap reference voltage generator of the present disclosure is significantly less than that consumed by the conventional bandgap reference voltage generator.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
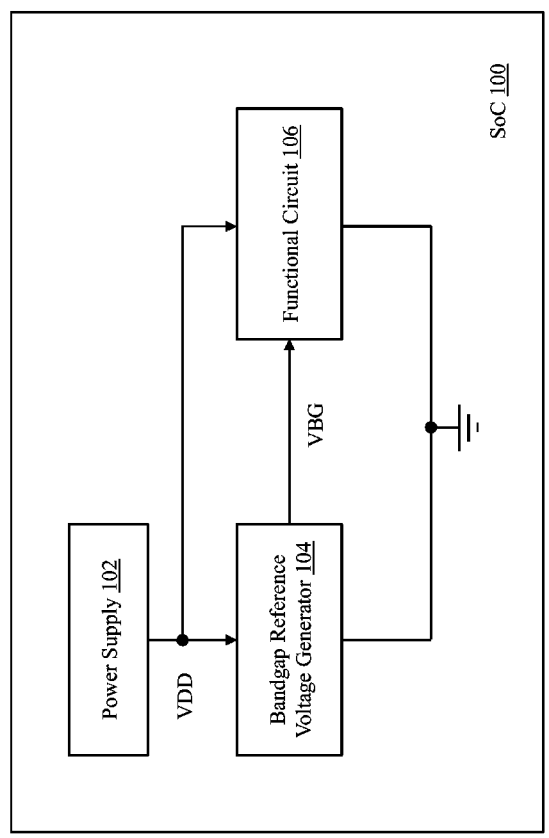
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 can include a power supply 102 that can be configured to generate a supply voltage VDD. The SoC 100 can further include a bandgap reference voltage generator 104 and a functional circuit 106. The SoC 100 can be included in various devices such as automotive devices, network devices, or the like.

The bandgap reference voltage generator 104 can be coupled between the power supply 102 and a ground terminal. The bandgap reference voltage generator 104 can be configured to receive the supply voltage VDD from the power supply 102, and generate a bandgap reference voltage VBG. In an embodiment, the bandgap reference voltage VBG is greater than a threshold value (not shown). In another embodiment, the bandgap reference voltage VBG is less than the threshold value. The threshold value can be equal to a bandgap reference voltage at 0 kelvin (K). The bandgap reference voltage generator 104 is explained in detail in conjunction with FIGS. 2, 3, 4A, 4B, 5A, and 5B.

The functional circuit 106 can be coupled between the power supply 102 and the ground terminal, and further coupled with the bandgap reference voltage generator 104. The functional circuit 106 can include suitable logic, circuitry, interfaces, and/or code, executable by the circuitry, that can be configured to perform one or more operations. For example, the functional circuit 106 can be configured to receive the bandgap reference voltage VBG and the supply voltage VDD from the bandgap reference voltage generator 104 and the power supply 102, respectively. Based on the bandgap reference voltage VBG and the supply voltage VDD, the functional circuit 106 can be further configured to execute a functional operation associated therewith. Examples of the functional circuit 106 can include analog-to-digital converters, low-dropout regulators, or the like.

Figure 2:
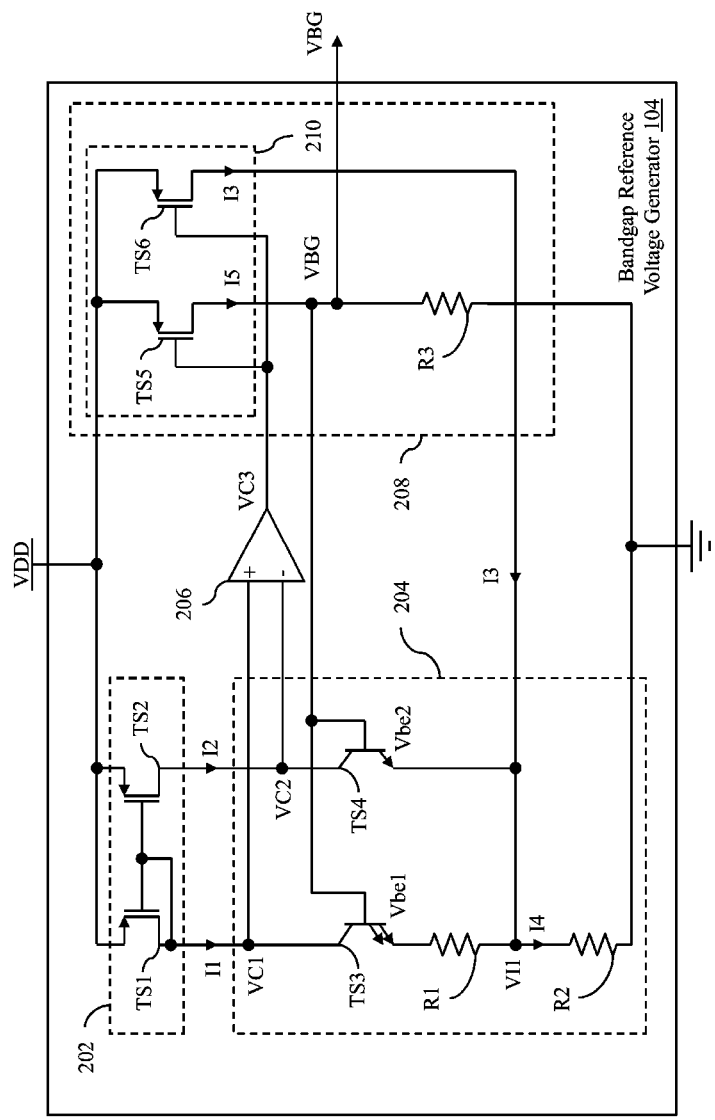
FIG. 2 illustrates a schematic circuit diagram of a bandgap reference voltage generator of the SoC of FIG. 1 in accordance with an embodiment of the present disclosure.

FIG. 2 illustrates a schematic circuit diagram of the bandgap reference voltage generator 104 in accordance with an embodiment of the present disclosure. The bandgap reference voltage generator 104 can include a first current mirror circuit 202, a bandgap core circuit 204, an amplifier 206, and first feedback circuitry 208.

The first current mirror circuit 202 can be coupled with the power supply 102, and configured to receive the supply voltage VDD, and output first and second currents I1 and I2. The first current mirror circuit 202 can include first and second transistors TS1 and TS2. The first and second transistors TS1 and TS2 have first terminals that can be coupled with the power supply 102, and configured to receive the supply voltage VDD. Second terminals of the first and second transistors TS1 and TS2 can be coupled with each other. The first transistor TS1 further has a third terminal that can be coupled with the second terminals of the first and second transistors TS1 and TS2, and configured to output the first current I1. Further, the second transistor TS2 has a third terminal that can be configured to output the second current I2. In an embodiment, the first and second transistors TS1 and TS2 are p-channel metal-oxide semiconductor (PMOS) transistors, and the first through third terminals of the first and second transistors TS1 and TS2 correspond to source, gate, and drain terminals, respectively.

Although FIG. 2 illustrates that the third terminal of the first transistor TS1 is coupled with the second terminals of the first and second transistors TS1 and TS2 to form the first current mirror circuit 202, it will be apparent to a person skilled in the art that the scope of the present disclosure is not limited to it. In an alternate embodiment, the third terminal of the second transistor TS2 may be coupled with the second terminals of the first and second transistors TS1 and TS2 to form the first current mirror circuit 202, without deviating from the scope of the present disclosure.

The bandgap core circuit 204 can be coupled with the first current mirror circuit 202 (i.e., the third terminals of the first and second transistors TS1 and TS2), and configured to receive the first and second currents I1 and I2. The bandgap core circuit 204 can be further coupled with the first feedback circuitry 208, and configured to receive the bandgap reference voltage VBG and a third current I3. Based on the first through third currents I1-I3 and the bandgap reference voltage VBG, the bandgap core circuit 204 can output first and second control voltages VC1 and VC2. The bandgap core circuit 204 can include third and fourth transistors TS3 and TS4, and first and second resistors R1 and R2.

Each transistor of the third and fourth transistors TS3 and TS4 has first through third terminals. The first terminals of the third and fourth transistors TS3 and TS4 can be coupled with the third terminals of the first and second transistors TS1 and TS2, and configured to receive the first and second currents I1 and I2, respectively. The first terminals of the third and fourth transistors TS3 and TS4 can be further configured to output the first and second control voltages VC1 and VC2, respectively. The second terminals of the third and fourth transistors TS3 and TS4 can be coupled with the first feedback circuitry 208, and configured to receive the bandgap reference voltage VBG. In an embodiment, the third and fourth transistors TS3 and TS4 are NPN transistors, and the first through third terminals of the third and fourth transistors TS3 and TS4 correspond to collector, base, and emitter terminals, respectively. Further, a size of the third transistor TS3 can be greater than a size of the fourth transistor TS4.

As the second and third terminals of the third and fourth transistors TS3 and TS4 correspond to base and emitter terminals, it will be apparent to a person skilled in the art that base-emitter voltages can be generated at junctions between the second and third terminals of the third and fourth transistors TS3 and TS4. For example, a first base-emitter voltage Vbe1 can be generated at a junction between the second and third terminals of the third transistor TS3. Similarly, a second base-emitter voltage Vbe2 can be generated at a junction between the second and third terminals of the fourth transistor TS4.

The first resistor R1 has first and second terminals coupled with the third terminals of the third and fourth transistors TS3 and TS4, respectively. For the sake of ongoing discussion, it is assumed that third and fourth transistors TS3 and TS4 pass the first and second currents I1 and I2, respectively, in entirety (i.e., sans any drop). Thus, the first and second terminals of the first resistor R1 can be configured to receive the first and second currents I1 and I2, respectively. The second terminal of the first resistor R1 can be further coupled with the first feedback circuitry 208, and further configured to receive the third current I3. Further, it will be apparent to a person skilled in the art that a current passing through a resistor remains unchanged. Thus, the second terminal of the first resistor R1 receives the first through third currents I1-I3. The first control voltage VC1 can thus be outputted based on the first and third currents I1 and I3 and the bandgap reference voltage VBG. Similarly, the second control voltage VC2 can be outputted based on the second and third currents I2 and I3 and the bandgap reference voltage VBG.

The second resistor R2 has a first terminal that can be coupled with the second terminal of the first resistor R1, and configured to receive a fourth current I4 and generate a first intermediate voltage VI1. The fourth current I4 is equal to a sum of the first through third currents I1-I3. The second resistor R2 further has a second terminal that can be coupled with the ground terminal. The bandgap reference voltage VBG is equal to a sum of the second base-emitter voltage Vbe2 of the fourth transistor TS4 and the first intermediate voltage VI1.

The amplifier 206 can be coupled with the first terminals of the third and fourth transistors TS3 and TS4, and the first feedback circuitry 208. The amplifier 206 can include suitable logic, circuitry, interfaces, and/or code, executable by the circuitry, that can be configured to perform one or more operations. For example, the amplifier 206 can be configured to receive the first and second control voltages VC1 and VC2 from the first terminals of the third and fourth transistors TS3 and TS4, respectively. In an embodiment, the amplifier 206 receives the first and second control voltages VC1 and VC2 at positive and negative input terminals thereof, respectively. The amplifier 206 can be further configured to generate a third control voltage VC3 based on the first and second control voltages VC1 and VC2, and provide the third control voltage VC3 to the first feedback circuitry 208. The third control voltage VC3 can be generated such that the third control voltage VC3 is greater than a difference between the first and second control voltages VC1 and VC2.

The first feedback circuitry 208 can be coupled with the power supply 102, and configured to receive the supply voltage VDD. The first feedback circuitry 208 can be further coupled with the amplifier 206, and configured to receive the third control voltage VC3. Based on the supply voltage VDD and the third control voltage VC3, the first feedback circuitry 208 can be further configured to generate the bandgap reference voltage VBG. Further, the first feedback circuitry 208 can be configured to output the third current I3 based on the supply voltage VDD and the third control voltage VC3. The first feedback circuitry 208 can be further coupled with the bandgap core circuit 204, and further configured to provide the bandgap reference voltage VBG to the bandgap core circuit 204. The first feedback circuitry 208 can output the third current I3 such that the third current I3 is sourced (i.e., provided) to the bandgap core circuit 204. Further, the first feedback circuitry 208 can be coupled with the functional circuit 106, and configured to provide the bandgap reference voltage VBG to the functional circuit 106. The first feedback circuitry 208 can include a first current replica circuit 210 and a third resistor R3.

The first current replica circuit 210 can be coupled with the power supply 102, and configured to receive the supply voltage VDD. The first current replica circuit 210 can be further coupled with the amplifier 206, and configured to receive the third control voltage VC3. Further, the first current replica circuit 210 can be configured to output a fifth current I5 and the third current I3. The fifth and third currents I5 and I3 can thus be outputted based on the supply voltage VDD and the third control voltage VC3.

The first current replica circuit 210 can include fifth and sixth transistors TS5 and TS6. The fifth and sixth transistors TS5 and TS6 have first terminals that can be coupled with the power supply 102, and configured to receive the supply voltage VDD. The fifth and sixth transistors TS5 and TS6 further have second terminals that can be coupled with the amplifier 206, and configured to receive the third control voltage VC3. In other words, the amplifier 206 can be coupled with the second terminals of the fifth and sixth transistors TS5 and TS6, and configured to provide the third control voltage VC3 to the second terminals of the fifth and sixth transistors TS5 and TS6. The fifth and sixth transistors TS5 and TS6 further have third terminals that can be configured to output the fifth and third currents I5 and I3, respectively. In an embodiment, the fifth and sixth transistors TS5 and TS6 are PMOS transistors, and the first through third terminals of the fifth and sixth transistors TS5 and TS6 correspond to source, gate, and drain terminals, respectively.

The first terminals (i.e., the source terminals) of the fifth and sixth transistors TS5 and TS6 are at a same voltage level (i.e., the supply voltage VDD). Similarly, the second terminals (i.e., the gate terminals) of the fifth and sixth transistors TS5 and TS6 are at a same voltage level (i.e., the third control voltage VC3). Thus, the fifth and sixth transistors TS5 and TS6 form the first current replica circuit 210. Further, sizes of the fifth and sixth transistors TS5 and TS6 are unequal. Hence, the third and fifth currents I3 and I5 are unequal. In one embodiment, the third current I3 is a scaled down version of the fifth current I5. Further, the third terminal of the sixth transistor TS6 can be coupled with the second terminal of the first resistor R1 (i.e., the bandgap core circuit 204), and output the third current I3 such that the third current I3 is sourced to the second terminal of the first resistor R1 (i.e., the bandgap core circuit 204).

The third resistor R3 has a first terminal that can be coupled with the ground terminal. The third resistor R3 further has a second terminal that can be coupled with the third terminal of the fifth transistor TS5 (i.e., the first current replica circuit 210), and configured to receive the fifth current I5 and generate the bandgap reference voltage VBG. The second terminal of the third resistor R3 can be further coupled with the second terminals of the third and fourth transistors TS3 and TS4, and further configured to provide the bandgap reference voltage VBG to the second terminals of the third and fourth transistors TS3 and TS4. In other words, the second terminals of the third and fourth transistors TS3 and TS4 can be configured to receive the bandgap reference voltage VBG from the second terminal of the third resistor R3. Further, the second terminal of the third resistor R3 can be coupled with the functional circuit 106, and configured to provide the bandgap reference voltage VBG to the functional circuit 106.

Although it is described that the bandgap reference voltage VBG can be generated at the second terminal of the third resistor R3, the scope of the present disclosure is not limited to it. In various other embodiments, the third resistor R3 can be split into various segments and the bandgap reference voltage VBG can be generated at any intermediate terminal of such segments, without deviating from the scope of the present disclosure. In such a scenario, a sum of resistance values of the segments is equal to a resistance value of the third resistor R3.

As the third current I3 is sourced to the bandgap core circuit 204 (i.e., the second terminal of the first resistor R1), a current passing through the second resistor R2 (i.e., the fourth current I4) increases, thereby increasing the first intermediate voltage VI1. As illustrated in FIG. 2, the bandgap reference voltage VBG is equal to a sum of the second base-emitter voltage Vbe2 of the fourth transistor TS4 and the first intermediate voltage VI1. Hence, as the first intermediate voltage VI1 increases, the bandgap reference voltage VBG increases and is greater than the threshold value (i.e., the bandgap reference voltage at 0 K).

The amplifier 206 and the first feedback circuitry 208 form a negative feedback loop with respect to the first current mirror circuit 202 and the bandgap core circuit 204. Such a negative feedback loop results in the first current I1 being equal to the second current I2. As the size of the third transistor TS3 is greater than that of the fourth transistor TS4, the first base-emitter voltage Vbe1 of the third transistor TS3 is less than the second base-emitter voltage Vbe2 of the fourth transistor TS4. The difference between the first and second base-emitter voltages Vbe1 and Vbe2 is generated across the first resistor R1. The first current I1 is shown below in equation (1):

$$I1 = \frac{\Delta Vbe}{R1} \quad (1)$$

where,
ΔVbe is the difference between the first and second base-emitter voltages Vbe1 and Vbe2.

The first terminal of the third resistor R3 receives the fifth current I5 and generates the bandgap reference voltage VBG. The fifth current I5 is shown below in equation (2):

$$I5 = \frac{VBG}{R3} \quad (2)$$

The third current I3 is a scaled down version of the fifth current I5. For the sake of ongoing discussion, it is assumed that the third current I3 is "k1" times the fifth current I5, where "k1" is a first scaling factor and is less than one. The third current I3 is shown below in equation (3) as:

$$I3 = \frac{k1 * VBG}{R3} \quad (3)$$

The first intermediate voltage VI1 is generated based on the fourth current I4. The fourth current I4 is equal to the sum of the first through third currents I1-I3. Further, the first and second currents I1 and I2 are equal. Thus, from the equations (1) and (3), the fourth current I4 is determined as shown below in equation (4):

$$I4 = \frac{2 * \Delta Vbe}{R1} + \frac{k1 * VBG}{R3} \quad (4)$$

Thus, from the equation (4), the first intermediate voltage VI1 is determined as shown below in equation (5):

$$VI1 = \frac{2 * \Delta Vbe * R2}{R1} + \frac{k1 * VBG * R2}{R3} \quad (5)$$

As illustrated in FIG. 2, the bandgap reference voltage VBG is equal to the sum of the second base-emitter voltage Vbe2 of the fourth transistor TS4 and the first intermediate voltage VI1. Thus, from the equation (5), the bandgap reference voltage VBG is determined as shown below in equation (6):

$$VBG = Vbe2 + \frac{2 * \Delta Vbe * R2}{R1} + \frac{k1 * VBG * R2}{R3} \quad (6)$$

The difference between the first and second base-emitter voltages Vbe1 and Vbe2 has a positive temperature co-efficient, whereas the second base-emitter voltage Vbe2 has a negative temperature co-efficient. Thus, based on resistance values of the first through third resistors R1-R3 and the first scaling factor "k1", a temperature-independent bandgap reference voltage VBG may be generated. The difference between the first and second base-emitter voltages Vbe1 and Vbe2 is shown below in equation (7):

$$\Delta Vbe = \frac{K_B * T}{q} * \ln\left(\frac{J1}{J2}\right) \quad (7)$$

where, $$\frac{K_B * T}{q}$$

is a thermal voltage at 300 K,

J1 is a current density of the third transistor TS3, and

J2 is a current density of the fourth transistor TS4.

A current density of a transistor is inversely proportional to a size of the transistor. Thus, as the size of the third transistor TS3 is greater than that of the fourth transistor TS4, the current density of the third transistor TS3 is less than that of the fourth transistor TS4. Further, the second base-emitter voltage Vbe2 is shown below in equation (8):

$$Vbe2 = V_{bg0} + \frac{T}{T_0}(V_{be0} - V_{bg0}) + \frac{(m-1)*K_B*T}{q} * \ln\left(\frac{T_0}{T}\right) \quad (8)$$

where, $T_0$ is a current temperature of the SoC 100, $V_{be0}$ is the base-emitter voltage of the fourth transistor TS4 at $T_0$, $V_{bg0}$=1.2345 volts (V), i.e., the bandgap reference voltage at 0 K, and m is a process-dependent value associated with the fourth transistor TS4.

On substituting the equations (7) and (8) in the equation (6), equation (9) is obtained as shown below:

$$VBG = V_{bg0} + \frac{T}{T_0}(V_{be0} - V_{bg0}) + \quad (9)$$
$$\frac{(m-1)*K_B*T}{q} * \ln\left(\frac{T_0}{T}\right) + \frac{2*R2*K_B*T}{R1*q} * \ln\left(\frac{J1}{J2}\right) + \frac{k1*VBG*R2}{R3}$$

Further, on rearranging the equation (9), equation (10) is obtained as shown below:

$$VBG\left(1 - \frac{k1*R2}{R3}\right) = V_{bg0} + \frac{T}{T_0}(V_{be0} - V_{bg0}) + \quad (10)$$
$$\frac{(m-1)*K_B*T}{q} * \ln\left(\frac{T_0}{T}\right) + \frac{2*R2*K_B*T}{R1*q} * \ln\left(\frac{J1}{J2}\right)$$

On differentiating the equation (10) with respect to T, at T=$T_0$, equation (11) is obtained as shown below:

$$\frac{dVBG}{dT}\left(1 - \frac{k1*R2}{R3}\right) = \frac{1}{T_0}(V_{be0} - V_{bg0}) + \quad (11)$$
$$\frac{(m-1)*K_B}{q} * \ln\left(\frac{T_0}{T_0}\right) - \frac{(m-1)*K_B}{q} + \frac{2*R2*K_B}{R1*q} * \ln\left(\frac{J1}{J2}\right)$$

On equating the equation (11) to zero, equation (12) is obtained as shown below:

$$V_{be0} + \frac{2*R2*K_B}{R1*q} * \ln\left(\frac{J1}{J2}\right) = V_{bg0} + \frac{(m-1)*K_B*T_0}{q} \quad (12)$$

On comparing the equations (10) and (12) at T=$T_0$, equation (12) is obtained as shown below:

$$VBG\left(1 - \frac{k1*R2}{R3}\right) = V_{bg0} + \frac{(m-1)*K_B*T_0}{q} \quad (13)$$

Further, on rearranging the equation (13), equation (14) is obtained as shown below:

$$VBG = \frac{V_{bg0} + (m-1)\frac{K_B*T_0}{q}}{\left(1 - \frac{k1*R2}{R3}\right)} \quad (14)$$

The bandgap reference voltage VBG is thus greater than the bandgap reference voltage at 0 K (i.e., the threshold value).

Figure 3:
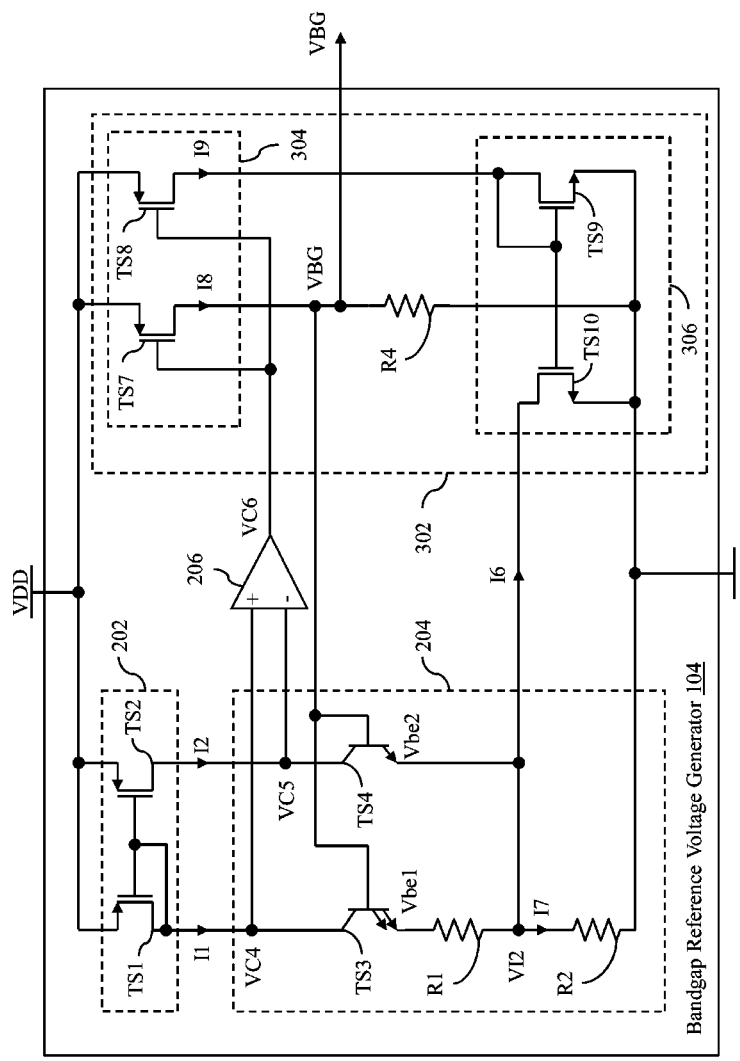
FIG. 3 illustrates a schematic circuit diagram of the bandgap reference voltage generator in accordance with another embodiment of the present disclosure.

FIG. 3 illustrates a schematic circuit diagram of the bandgap reference voltage generator 104 in accordance with another embodiment of the present disclosure. The bandgap reference voltage generator 104 can include the first current mirror circuit 202, the bandgap core circuit 204, the amplifier 206, and second feedback circuitry 302.

The first current mirror circuit 202 can be coupled with the power supply 102, and configured to receive the supply voltage VDD, and output first and second currents I1 and I2. The first current mirror circuit 202 can include the first and second transistors TS1 and TS2. The first terminals of the first and second transistors TS1 and TS2 can be coupled with the power supply 102, and configured to receive the supply voltage VDD, and the second terminals of the first and second transistors TS1 and TS2 can be coupled with each other. The third terminal of the first transistor TS1 can be coupled with the second terminals of the first and second transistors TS1 and TS2, and configured to output the first current I1. Further, the third terminal of the second transistor TS2 can be configured to output the second current I2.

The bandgap core circuit 204 can be coupled with the first current mirror circuit 202, and configured to receive the first and second currents I1 and I2. The bandgap core circuit 204 can be further coupled with the second feedback circuitry 302, and configured to receive the bandgap reference voltage VBG. Further, the coupling between the bandgap core circuit 204 and the second feedback circuitry 302 can be such that a sixth current I6 outputted by the second feedback circuitry 302 is sank from the bandgap core circuit 204. Based on the first, second, and sixth currents I1, I2, and I6 and the bandgap reference voltage VBG, the bandgap core circuit 204 can be further configured to output fourth and fifth control voltages VC4 and VC5.

The bandgap core circuit 204 can include the third and fourth transistors TS3 and TS4, and the first and second resistors R1 and R2. The first terminals of the third and fourth transistors TS3 and TS4 can be coupled with the third terminals of the first and second transistors TS1 and TS2, and configured to receive the first and second currents I1 and I2, respectively. The first terminals of the third and fourth transistors TS3 and TS4 can be further configured to output the fourth and fifth control voltages VC4 and VC5, respectively. The second terminals of the third and fourth transistors TS3 and TS4 can be coupled with the second feedback circuitry 302, and configured to receive the bandgap reference voltage VBG.

The first and second terminals of the first resistor R1 can be coupled with the third terminals of the third and fourth transistors TS3 and TS4, and configured to receive the first and second currents I1 and I2, respectively. The second terminal of the first resistor R1 can be further coupled with the second feedback circuitry 302. The coupling of the second terminal of the first resistor R1 and the second feedback circuitry 302 can be such that the sixth current I6 outputted by the second feedback circuitry 302 is sank from the second terminal of the first resistor R1. The fourth control voltage VC4 can thus be outputted based on the first and sixth currents I1 and I6 and the bandgap reference voltage VBG. Similarly, the fifth control voltage VC5 can be outputted based on the second and sixth currents I2 and I6 and the bandgap reference voltage VBG.

The first terminal of the second resistor R2 can be coupled with the second terminal of the first resistor R1, and configured to receive a seventh current I7 and generate a second intermediate voltage VI2. The seventh current I7 can be equal to a difference between the sixth current I6 and a sum of the first and second currents I1 and I2. The second resistor R2 further has a second terminal that can be coupled with the ground terminal. The bandgap reference voltage VBG can be equal to a sum of the second base-emitter voltage Vbe2 of the fourth transistor TS4 and the second intermediate voltage VI2.

The amplifier 206 can be coupled with the first terminals of the third and fourth transistors TS3 and TS4, and the second feedback circuitry 302. The amplifier 206 can be configured to receive the fourth and fifth control voltages VC4 and VC5 from the first terminals of the third and fourth transistors TS3 and TS4, respectively. In an embodiment, the amplifier 206 receives the fourth and fifth control voltages VC4 and VC5 at positive and negative input terminals thereof, respectively. The amplifier 206 can be further configured to generate a sixth control voltage VC6 based on the fourth and fifth control voltages VC4 and VC5, and provide the sixth control voltage VC6 to the second feedback circuitry 302. The sixth control voltage VC6 can be generated such that the sixth control voltage VC6 can be greater than a difference between the fourth and fifth control voltages VC4 and VC5.

The second feedback circuitry 302 can be coupled with the power supply 102, and configured to receive the supply voltage VDD. The second feedback circuitry 302 can be further coupled with the amplifier 206, and configured to receive the sixth control voltage VC6. Based on the supply voltage VDD and the sixth control voltage VC6, the second feedback circuitry 302 can be further configured to generate the bandgap reference voltage VBG. The second feedback circuitry 302 can be further configured to output the sixth current I6 based on the supply voltage VDD and the sixth control voltage VC6. The second feedback circuitry 302 can be further coupled with the bandgap core circuit 204, and further configured to provide the bandgap reference voltage VBG to the bandgap core circuit 204. Further, the second feedback circuitry 302 can output the sixth current I6 such that the sixth current I6 is sank from the bandgap core circuit 204. The second feedback circuitry 302 can be further coupled with the functional circuit 106, and further configured to provide the bandgap reference voltage VBG to the functional circuit 106. The second feedback circuitry 302 can include a second current replica circuit 304, a fourth resistor R4, and a second current mirror circuit 306.

The second current replica circuit 304 can be coupled with the power supply 102, and configured to receive the supply voltage VDD. The second current replica circuit 304 can be further coupled with the amplifier 206, and configured to receive the sixth control voltage VC6. Further, the second current replica circuit 304 can be configured to output eighth and ninth currents I8 and I9. The eighth and ninth currents I8 and I9 can thus be outputted based on the supply voltage VDD and the sixth control voltage VC6.

The second current replica circuit 304 can include seventh and eighth transistors TS7 and TS8. The seventh and eighth transistors TS7 and TS8 have first terminals that can be coupled with the power supply 102, and configured to receive the supply voltage VDD. The seventh and eighth transistors TS7 and TS8 further have second terminals that can be coupled with the amplifier 206, and configured to receive the sixth control voltage VC6. In other words, the amplifier 206 can be coupled with the second terminals of the seventh and eighth transistors TS7 and TS8, and configured to provide the sixth control voltage VC6 to the second terminals of the seventh and eighth transistors TS7 and TS8. The seventh and eighth transistors TS7 and TS8 further have third terminals that can be configured to output the eighth and ninth currents I8 and I9, respectively. The eighth and ninth currents I8 and I9 can thus be outputted based on the supply voltage VDD and the sixth control voltage VC6. In an embodiment, the seventh and eighth transistors TS7 and TS8 are PMOS transistors, and the first through third terminals of the seventh and eighth transistors TS7 and TS8 correspond to source, gate, and drain terminals, respectively.

The first terminals (i.e., the source terminals) of the seventh and eighth transistors TS7 and TS8 are at a same voltage level (i.e., the supply voltage VDD). Similarly, the second terminals (i.e., the gate terminals) of the seventh and eighth transistors TS7 and TS8 are at a same voltage level (i.e., the sixth control voltage VC6). Thus, the seventh and eighth transistors TS7 and TS8 form the second current replica circuit 304. Further, sizes of the seventh and eighth transistors TS7 and TS8 are unequal. Hence, the eighth and ninth currents I8 and I9 are unequal. In one embodiment, the ninth current I9 is a scaled down version of the eighth current I8.

The second current mirror circuit 306 can be coupled with the third terminal of the eighth transistor TS8 (i.e., the second current replica circuit 304), and configured to receive the ninth current I9. Further, the second current mirror circuit 306 can be coupled with the bandgap core circuit 204, and configured to output, based on the ninth current I9, the sixth current I6 such that the sixth current I6 is sank from the bandgap core circuit 204.

The second current mirror circuit 306 can include ninth and tenth transistors TS9 and TS10. The ninth and tenth transistors TS9 and TS10 have first terminals that can be coupled with the ground terminal, and second terminals that can be coupled with each other. The ninth transistor TS9 further has a third terminal that can be coupled with the second terminals of the ninth and tenth transistors TS9 and TS10 and the third terminal of the eighth transistor TS8, and configured to receive the ninth current I9. The tenth transistor TS10 further has a third terminal that can be coupled with the second terminal of the first resistor R1, and configured to output the sixth current I6 such that the sixth current I6 is sank from the second terminal of the first resistor R1. In an embodiment, the ninth and tenth transistors TS9 and TS10 are n-channel metal-oxide semiconductor (NMOS) transistors, and the first through third terminals of the ninth and tenth transistors TS9 and TS10 correspond to source, gate, and drain terminals, respectively. For the sake of ongoing discussion, it is assumed that a mirroring ratio of the second current mirror circuit 306 is one. Thus, the sixth current I6 is equal to the ninth current I9. However, it will be apparent to a person skilled in the art that the scope of the present disclosure is not limited to the mirroring ratio of the second current mirror circuit 306 being one. In various other embodiments, the mirroring ratio of the second current mirror circuit 306 can be less than or greater than one, without deviating from the scope of the present disclosure.

The fourth resistor R4 has a first terminal that can be coupled with the ground terminal. The fourth resistor R4 further has a second terminal that can be coupled with the third terminal of the seventh transistor TS7 (i.e., the second current replica circuit 304), and configured to receive the eighth current I8 and generate the bandgap reference voltage VBG. The second terminal of the fourth resistor R4 can be further coupled with the second terminals of the third and fourth transistors TS3 and TS4, and configured to provide the bandgap reference voltage VBG to the second terminals of the third and fourth transistors TS3 and TS4. In other words, the second terminals of the third and fourth transistors TS3 and TS4 can be configured to receive the bandgap reference voltage VBG from the second terminal of the fourth resistor R4. Further, the second terminal of the fourth resistor R4 can be coupled with the functional circuit 106, and configured to provide the bandgap reference voltage VBG to the functional circuit 106.

Although it is described that the bandgap reference voltage VBG is generated at the second terminal of the fourth resistor R4, the scope of the present disclosure is not limited to it. In various other embodiments, the fourth resistor R4 can be split into various segments and the bandgap reference voltage VBG can be generated at any intermediate terminal of such segments, without deviating from the scope of the present disclosure. In such a scenario, a sum of resistance values of the segments is equal to a resistance value of the fourth resistor R4.

As the sixth current I6 is sank from the bandgap core circuit 204 (i.e., the second terminal of the first resistor R1), a current passing through the second resistor R2 (i.e., the seventh current I7) decreases, thereby decreasing the second intermediate voltage VI2. As illustrated in FIG. 3, the bandgap reference voltage VBG is equal to a sum of the second base-emitter voltage Vbe2 of the fourth transistor TS4 and the second intermediate voltage VI2. Hence, as the second intermediate voltage VI2 decreases, the bandgap reference voltage VBG decreases and is less than the threshold value (i.e., the bandgap reference voltage at 0 K).

The amplifier 206 and the second feedback circuitry 302 form a negative feedback loop with respect to the first current mirror circuit 202 and the bandgap core circuit 204. Such a negative feedback loop results in the first current I1 being equal to the second current I2. As the size of the third transistor TS3 is greater than that of the fourth transistor TS4, the first base-emitter voltage Vbe1 of the third transistor TS3 is less than the second base-emitter voltage Vbe2 of the fourth transistor TS4. The difference between the first and second base-emitter voltages Vbe1 and Vbe2 is generated across the first resistor R1. The first current I1 is shown below in equation (15):

$$I1 = \frac{\Delta Vbe}{R1} \tag{15}$$

The first terminal of the fourth resistor R4 receives the eighth current I8 and generates the bandgap reference voltage VBG. The eighth current I8 is shown below in equation (16):

$$I8 = \frac{VBG}{R4} \tag{16}$$

The ninth current I9 is a scaled down version of the eighth current I8. For the sake of ongoing discussion, it is assumed that the ninth current is "k2" times the eighth current I8, where "k2" is a second scaling factor and is less than one. The ninth current I9 is shown below in equation (17):

$$I9 = \frac{k2 * VBG}{R4} \tag{17}$$

The second intermediate voltage VI2 is generated based on the seventh current I7. The seventh current I7 is equal to a difference between the sixth current I6 and the sum of the first and second currents I1 and I2. Further, the first and second currents I1 and I2 are equal and the sixth current I6 is equal to the ninth current I9. Thus, from the equations (15) and (17), the seventh current I7 is determined as shown below in equation (18):

$$I7 = \frac{2*\Delta Vbe}{R1} - \frac{k2*VBG}{R4} \tag{18}$$

Thus, from the equation (18), the second intermediate voltage VI2 is determined as shown below in equation (19):

$$VI2 = \frac{2*\Delta Vbe*R2}{R1} - \frac{k2*VBG*R2}{R4} \tag{19}$$

As illustrated in FIG. 3, the bandgap reference voltage VBG is equal to the sum of the second base-emitter voltage Vbe2 of the fourth transistor TS4 and the second intermediate voltage VI2. Thus, from the equation (19), the bandgap reference voltage VBG is determined as shown below in equation (20):

$$VBG = Vbe2 + \frac{2*\Delta Vbe*R2}{R1} - \frac{k2*VBG*R2}{R4} \tag{20}$$

The difference between the first and second base-emitter voltages Vbe1 and Vbe2 has a positive temperature co-efficient, whereas the second base-emitter voltage Vbe2 has a negative temperature co-efficient. Thus, based on resistance values of the first, second, and fourth resistors R1, R2, and R4 and the second scaling factor "k2", a temperature-independent bandgap reference voltage VBG can be generated. The difference between the first and second base-emitter voltages Vbe1 and Vbe2 is shown below in equation (21):

$$\Delta Vbe = \frac{K_B*T}{q}*\ln\left(\frac{J1}{J2}\right) \tag{21}$$

Further, the second base-emitter voltage Vbe2 is shown below in equation (22):

$$Vbe2 = V_{bg0} + \frac{T}{T_0}(V_{be0} - V_{bg0}) + \frac{(m-1)*K_B*T}{q}*\ln\left(\frac{T_0}{T}\right) \tag{22}$$

On substituting the equations (21) and (22) in equation (20), equation (23) is obtained as shown below:

$$VBG = V_{bg0} + \frac{T}{T_0}(V_{be0} - V_{bg0}) + \frac{(m-1)*K_B*T}{q}*\ln\left(\frac{T_0}{T}\right) + \frac{2*R2*K_B*T}{R1*q}*\ln\left(\frac{J1}{J2}\right) - \frac{k2*VBG*R2}{R4} \tag{23}$$

Further, on rearranging the equation (23), equation (24) is obtained as shown below:

$$VBG\left(1 + \frac{k2*R2}{R4}\right) = V_{bg0} + \frac{T}{T_0}(V_{be0} - V_{bg0}) + \tag{24}$$

$$\frac{(m-1)*K_B*T}{q}*\ln\left(\frac{T_0}{T}\right) + \frac{2*R2*K_B*T}{R1*q}*\ln\left(\frac{J1}{J2}\right)$$

On differentiating the equation (24) with respect to T, at T=T$_0$, equation (25) is obtained as shown below:

$$\frac{dVBG}{dT}\left(1 + \frac{k2*R2}{R4}\right) = \frac{1}{T_0}(V_{be0} - V_{bg0}) + \tag{25}$$

$$\frac{(m-1)*K_B}{q}*\ln\left(\frac{T_0}{T_0}\right) - \frac{(m-1)*K_B}{q} + \frac{2*R2*K_B}{R1*q}*\ln\left(\frac{J1}{J2}\right)$$

On equating the equation (25) to zero, equation (26) is obtained as shown below:

$$V_{be0} + \frac{2*R2*K_B}{R1*q}*\ln\left(\frac{J1}{J2}\right) = V_{bg0} + \frac{(m-1)*K_B*T_0}{q} \tag{26}$$

On comparing the equations (24) and (26) at T=T$_0$, equation (27) is obtained as shown below:

$$VBG\left(1 + \frac{k2*R2}{R4}\right) = V_{bg0} + \frac{(m-1)*K_B*T_0}{q} \tag{27}$$

Further, on rearranging the equation (27), equation (28) is obtained as shown below:

$$VBG = \frac{V_{bg0} + (m-1)\frac{K_B*T_0}{q}}{\left(1 + \frac{k2*R2}{R4}\right)} \tag{28}$$

The bandgap reference voltage VBG is thus less than the bandgap reference voltage at 0 K (i.e., the threshold value).

Figure 4A:
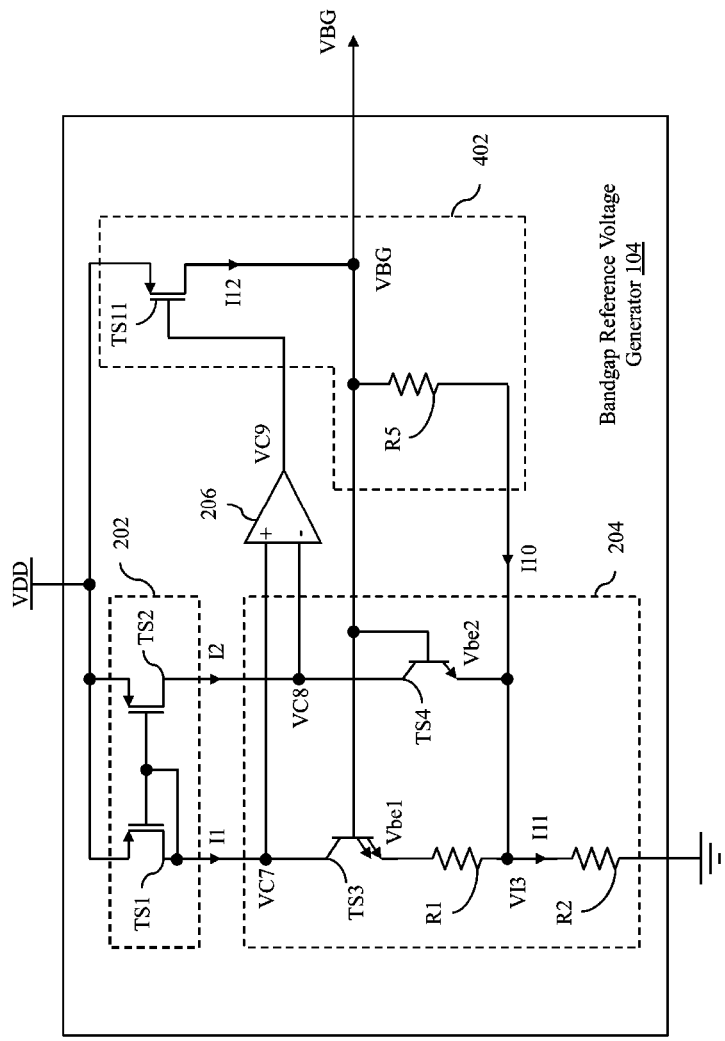
FIG. 4A illustrates a schematic circuit diagram of the bandgap reference voltage generator in accordance with yet another embodiment of the present disclosure.

FIG. 4A illustrates a schematic circuit diagram of the bandgap reference voltage generator 104 in accordance with yet another embodiment of the present disclosure. The bandgap reference voltage generator 104 can include the first current mirror circuit 202, the bandgap core circuit 204, the amplifier 206, and third feedback circuitry 402.

The first current mirror circuit 202 can be coupled with the power supply 102, and configured to receive the supply voltage VDD, and output the first and second currents I1 and I2. The first current mirror circuit 202 can include the first and second transistors TS1 and TS2. The first terminals of the first and second transistors TS1 and TS2 can be coupled with the power supply 102, and configured to receive the supply voltage VDD, and the second terminals of the first and second transistors TS1 and TS2 can be coupled with each other. The third terminal of the first transistor TS1 can be coupled with the second terminals of the first and second transistors TS1 and TS2, and configured to output the first current I1. Further, the third terminal of the second transistor TS2 can be configured to output the second current I2.

The bandgap core circuit 204 can be coupled with the first current mirror circuit 202, and configured to receive the first and second currents I1 and I2. The bandgap core circuit 204 can be further coupled with the third feedback circuitry 402, and configured to receive the bandgap reference voltage VBG and a tenth current I10. Based on the first, second, and tenth currents I1, I2, and I10 and the bandgap reference voltage VBG, the bandgap core circuit 204 can be further configured to output seventh and eighth control voltages VC7 and VC8.

The bandgap core circuit 204 can include the third and fourth transistors TS3 and TS4, and the first and second resistors R1 and R2. The first terminals of the third and fourth transistors TS3 and TS4 can be coupled with the first current mirror circuit 202, and configured to receive the first and second currents I1 and I2, respectively. The first terminals of the third and fourth transistors TS3 and TS4 can be further configured to output the seventh and eighth control voltages VC7 and VC8, respectively. The second terminals of the third and fourth transistors TS3 and TS4 can be coupled with the third feedback circuitry 402, and configured to receive the bandgap reference voltage VBG.

The first and second terminals of the first resistor R1 can be coupled with the third terminals of the third and fourth transistors TS3 and TS4, and configured to receive the first and second currents I1 and I2, respectively. The second terminal of the first resistor R1 can be further coupled with the third feedback circuitry 402, and further configured to receive the tenth current I10. The seventh control voltage VC7 can thus be outputted based on the first and tenth currents I1 and I10 and the bandgap reference voltage VBG. Similarly, the eighth control voltage VC8 can be outputted based on the second and tenth currents I2 and I10 and the bandgap reference voltage VBG.

The first terminal of the second resistor R2 can be coupled with the second terminal of the first resistor R1, and configured to receive an eleventh current I11 and generate a third intermediate voltage VI3. The eleventh current I11 is equal to a sum of the first, second, and tenth currents I1, I2, and I10. The second terminal of the second resistor R2 can be coupled with the ground terminal. The bandgap reference voltage VBG is equal to a sum of the second base-emitter voltage Vbe2 of the fourth transistor TS4 and the third intermediate voltage VI3.

The amplifier 206 can be coupled with the first terminals of the third and fourth transistors TS3 and TS4, and the third feedback circuitry 402. The amplifier 206 can be configured to receive the seventh and eighth control voltages VC7 and VC8 from the first terminals of the third and fourth transistors TS3 and TS4, respectively. In an embodiment, the amplifier 206 receives the seventh and eighth control voltages VC7 and VC8 at positive and negative input terminals thereof, respectively. The amplifier 206 can be further configured to generate a ninth control voltage VC9 based on the seventh and eighth control voltages VC7 and VC8, and provide the ninth control voltage VC9 to the third feedback circuitry 402. The ninth control voltage VC9 can be generated such that the ninth control voltage VC9 can be greater than a difference between the seventh and eighth control voltages VC7 and VC8.

The third feedback circuitry 402 can be coupled with the power supply 102, and configured to receive the supply voltage VDD. The third feedback circuitry 402 can be further coupled with the amplifier 206, and configured to receive the ninth control voltage VC9. Based on the supply voltage VDD and the ninth control voltage VC9, the third feedback circuitry 402 can be further configured to generate the bandgap reference voltage VBG and the tenth current I10 based on the supply voltage VDD and the ninth control voltage VC9. Further, the third feedback circuitry 402 can be coupled with the bandgap core circuit 204, and configured to provide the bandgap reference voltage VBG and the tenth current I10 to the bandgap core circuit 204. The third feedback circuitry 402 can be further coupled with the functional circuit 106, and further configured to provide the bandgap reference voltage VBG to the functional circuit 106. The third feedback circuitry 402 can include an eleventh transistor TS11 and a fifth resistor R5.

The eleventh transistor TS11 has a first terminal that can be coupled with the power supply 102, and configured to receive the supply voltage VDD. The eleventh transistor TS11 further has a second terminal that can be coupled with the amplifier 206, and configured to receive the ninth control voltage VC9. In other words, the amplifier 206 can be coupled with the second terminal of the eleventh transistor TS11, and configured to provide the ninth control voltage VC9 to the second terminal of the eleventh transistor TS11. The eleventh transistor TS11 further has a third terminal that can be configured to output a twelfth current I12. The twelfth current I12 can thus be outputted based on the supply voltage VDD and the ninth control voltage VC9. In an embodiment, the eleventh transistor TS11 is a PMOS transistor, and the first through third terminals of the eleventh transistor TS11 correspond to source, gate, and drain terminals, respectively.

The fifth resistor R5 has a first terminal that can be coupled with the third terminal of the eleventh transistor TS11, and configured to receive the twelfth current I12 and generate the bandgap reference voltage VBG. The first terminal of the fifth resistor R5 can be further coupled with the second terminals of the third and fourth transistors TS3 and TS4, and configured to provide the bandgap reference voltage VBG to the second terminals of the third and fourth transistors TS3 and TS4. In other words, the second terminals of the third and fourth transistors TS3 and TS4 can be configured to receive the bandgap reference voltage VBG from the first terminal of the fifth resistor R5. The first terminal of the fifth resistor R5 can be further coupled with the functional circuit 106, and configured to provide the bandgap reference voltage VBG to the functional circuit 106. The fifth resistor R5 further has a second terminal that can be coupled with the bandgap core circuit 204 (i.e., the second terminal of the first resistor R1), and configured to generate and provide the tenth current I10 to the second terminal of the first resistor R1. In an embodiment, the tenth and twelfth currents I10 and I12 are equal.

As the tenth current I10 is sourced to the bandgap core circuit 204 (i.e., the second terminal of the first resistor R1), a current passing through the second resistor R2 (i.e., the eleventh current I11) increases, thereby increasing the third intermediate voltage VI3. As illustrated in FIG. 4A, the bandgap reference voltage VBG is equal to a sum of the second base-emitter voltage Vbe2 of the fourth transistor TS4 and the third intermediate voltage VI3. Hence, as the third intermediate voltage VI3 increases, the bandgap reference voltage VBG increases and is greater than the threshold value (i.e., the bandgap reference voltage at 0 K).

The amplifier 206 and the third feedback circuitry 402 form a negative feedback loop with respect to the first current mirror circuit 202 and the bandgap core circuit 204. Such a negative feedback loop results in the first current I1 being equal to the second current I2. As the size of the third transistor TS3 is greater than that of the fourth transistor TS4, the first base-emitter voltage Vbe1 of the third transistor TS3 is less than the second base-emitter voltage Vbe2 of the fourth transistor TS4. The difference between the first and second base-emitter voltages Vbe1 and Vbe2 is generated across the first resistor R1. Thus, the first current I1 is shown below in equation (29):

$$I1 = \frac{\Delta Vbe}{R1} \quad (29)$$

As illustrated in FIG. 4A, the voltage across the fifth resistor R5 is equal to the second base-emitter voltage Vbe2. Further, the tenth current I10 passes through the fifth resistor R5. The tenth current I10 is shown below in equation (30):

$$I10 = \frac{Vbe2}{R5} \quad (30)$$

The third intermediate voltage VI3 is generated based on the eleventh current I11. The eleventh current I11 is equal to the sum of the first, second, and tenth currents I1, I2, and I10. Further, the first and second currents I1 and I2 are equal. Thus, from the equations (29) and (30), the eleventh current I11 is determined as shown below in equation (31):

$$I11 = \frac{2 * \Delta Vbe}{R1} + \frac{Vbe2}{R5} \quad (31)$$

Thus, from the equation (31), the third intermediate voltage VI3 is determined as shown below in equation (32):

$$VI3 = \frac{2 * \Delta Vbe * R2}{R1} + \frac{Vbe2 * R2}{R5} \quad (32)$$

As illustrated in FIG. 4A, the bandgap reference voltage VBG is equal to the sum of the second base-emitter voltage Vbe2 of the fourth transistor TS4 and the third intermediate voltage VI3. Thus, from the equation (32), the bandgap reference voltage VBG is determined as shown below in equation (33):

$$VBG = Vbe2 + \frac{2 * \Delta Vbe * R2}{R1} + \frac{Vbe2 * R2}{R5} \quad (33)$$

Further, on rearranging the equation (33), equation (34) is obtained as shown below:

$$VBG = \left(1 + \frac{R2}{R5}\right) Vbe2 + \frac{2 * \Delta Vbe * R2}{R1} \quad (34)$$

The difference between the first and second base-emitter voltages Vbe1 and Vbe2 is shown below in equation (35):

$$\Delta Vbe = \frac{K_B * T}{q} * \ln\left(\frac{J1}{J2}\right) \quad (35)$$

The second base-emitter voltage Vbe2 is below shown in equation (36):

$$Vbe2 = V_{bg0} + \frac{T}{T_0}(V_{be0} - V_{bg0}) + \frac{(m-1) * K_B * T}{q} * \ln\left(\frac{T_0}{T}\right) \quad (36)$$

On substituting the equations (35) and (36) in the equation (34), equation (37) is obtained as shown below:

$$VBG = \quad (37)$$
$$\left(1 + \frac{R2}{R5}\right)\left(V_{bg0} + \frac{T}{T_0}(V_{be0} - V_{bg0}) + \frac{(m-1) * K_B * T}{q} * \ln\left(\frac{T_0}{T}\right)\right) +$$
$$\frac{2 * R2 * K_B * T}{R1 * q} * \ln\left(\frac{J1}{J2}\right)$$

On differentiating the equation (37) with respect to T, at T=T$_0$, equation (38) is obtained as shown below:

$$\frac{dVBG}{dT} = \quad (38)$$
$$\left(1 + \frac{R2}{R5}\right)\left(\frac{1}{T_0}(V_{be0} - V_{bg0}) + \frac{(m-1) * K_B}{q} * \ln\left(\frac{T_0}{T}\right) - \frac{(m-1) * K_B}{q}\right) +$$
$$\frac{2 * R2 * K_B}{R1 * q} * \ln\left(\frac{J1}{J2}\right)$$

On equating the equation (38) to zero, equation (39) is obtained as shown below:

$$\left(1 + \frac{R2}{R5}\right) V_{be0} + \frac{2 * R2 * K_B}{R1 * q} * \ln\left(\frac{J1}{J2}\right) = \quad (39)$$
$$\left(1 + \frac{R2}{R5}\right) V_{bg0} + \frac{(m-1) * K_B * T_0}{q}$$

On comparing the equations (39) and (37) at T=T$_0$, equation (40) is obtained as shown below:

$$VBG = \left(1 + \frac{R2}{R5}\right) V_{bg0} + \frac{(m-1) * K_B * T_0}{q} \quad (40)$$

The bandgap reference voltage VBG is thus greater than the bandgap reference voltage at 0 K (i.e., the threshold value). The bandgap reference voltage VBG generated by the bandgap reference voltage generator 104 of FIG. 4A is temperature-dependent.

Although FIG. 4A describes that the bandgap reference voltage VBG is generated at the first terminal of the fifth resistor R5, the scope of the present disclosure is not limited to it. In an alternate embodiment, the bandgap reference voltage VBG can be generated at the second terminal of the fifth resistor R5, without deviating from the scope of the present disclosure. In such a scenario, the bandgap reference voltage VBG is less than the bandgap reference voltage at 0 K (i.e., the threshold value).

Figure 4B:
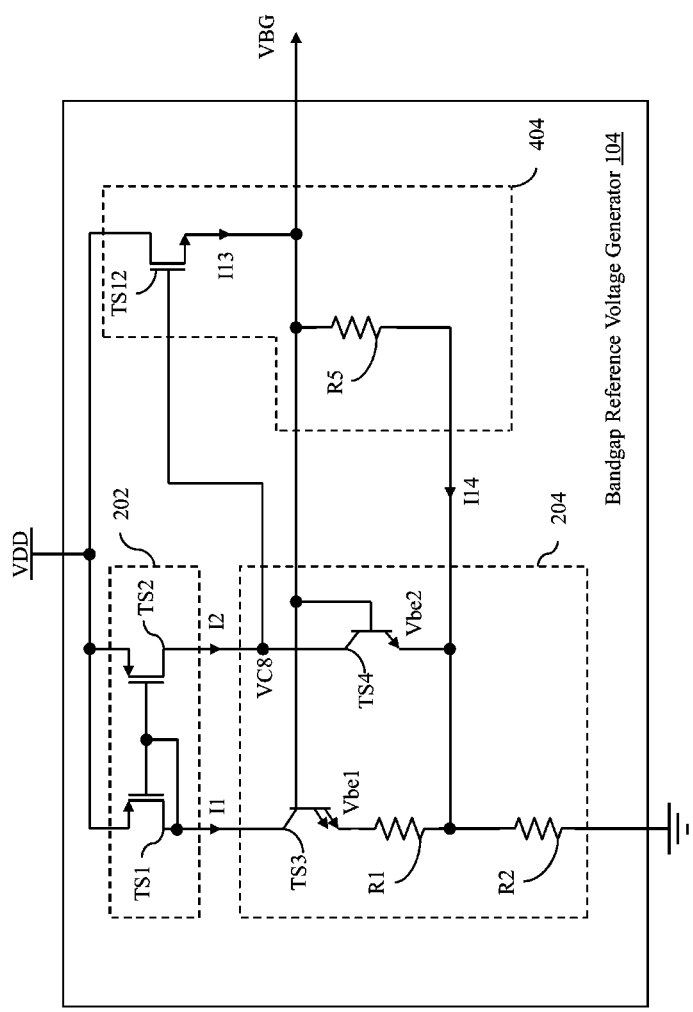
FIG. 4B illustrates a schematic circuit diagram of the bandgap reference voltage generator in accordance with yet another embodiment of the present disclosure.

FIG. 4B illustrates a schematic circuit diagram of the bandgap reference voltage generator 104 in accordance with yet another embodiment of the present disclosure. The bandgap reference voltage generator 104 can include the first current mirror circuit 202, the bandgap core circuit 204, and fourth feedback circuitry 404.

The structure and functionalities of the first current mirror circuit 202 and the bandgap core circuit 204 remain same as described in FIG. 4A. The difference between the embodiments of FIG. 4A and FIG. 4B is in the absence of the amplifier 206. As illustrated in FIG. 4B, the third feedback circuitry 402 (i.e., the second terminal of the eleventh transistor TS11) receives the eighth control voltage VC8, as compared to the ninth control voltage VC9 as described in FIG. 4A. In other words, the first terminal of the fourth transistor TS4 can be directly coupled with the second terminal of the eleventh transistor TS11, and configured to provide the eighth control voltage VC8 to the second terminal of the eleventh transistor TS11.

The fourth feedback circuitry 404 is functionally similar to the third feedback circuitry 402. The difference between the third and fourth feedback circuitries 402 and 404 is that the PMOS transistor of the third feedback circuitry 402 (i.e., the eleventh transistor TS11) is replaced by an NMOS transistor (i.e., a twelfth transistor TS12) in the fourth feedback circuitry 404. The twelfth transistor TS12 can be configured to output a thirteenth current I13 based on the supply voltage VDD and the eighth control voltage VC8. Further, the first and second terminals of the fifth resistor R5 can then be configured to generate the bandgap reference voltage VBG and a fourteenth current I14, respectively, based on the thirteenth current I13 in a similar manner as described above in FIG. 4A. The bandgap reference voltage VBG and the fourteenth current I14 can then be provided to the bandgap core circuit 204 to facilitate the generation of the eighth control voltage VC8.

Figure 5A:
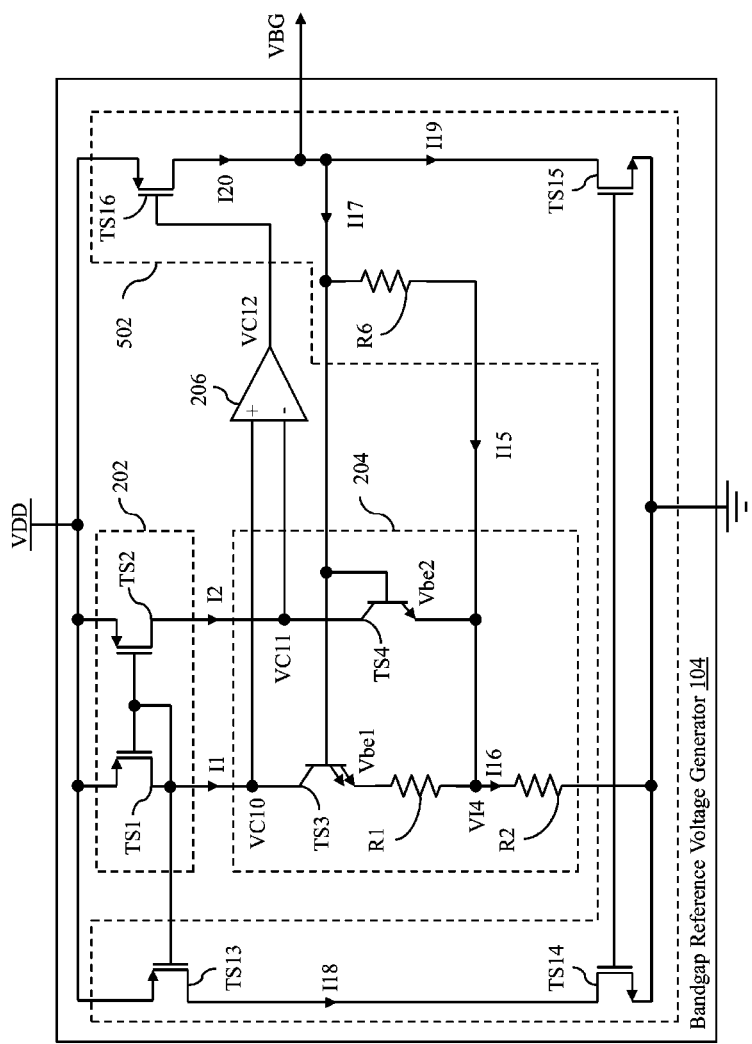
FIG. 5A illustrates a schematic circuit diagram of the bandgap reference voltage generator in accordance with yet another embodiment of the present disclosure.

FIG. 5A illustrates a schematic circuit diagram of the bandgap reference voltage generator 104 in accordance with yet another embodiment of the present disclosure. The bandgap reference voltage generator 104 can include the first current mirror circuit 202, the bandgap core circuit 204, the amplifier 206, and fifth feedback circuitry 502.

The first current mirror circuit 202 can be coupled with the power supply 102, and configured to receive the supply voltage VDD, and output the first and second currents I1 and I2. The first current mirror circuit 202 can include the first and second transistors TS1 and TS2. The first terminals of the first and second transistors TS1 and TS2 can be coupled with the power supply 102, and configured to receive the supply voltage VDD, and the second terminals of the first and second transistors TS1 and TS2 can be coupled with each other. The third terminal of the first transistor TS1 can be coupled with the second terminals of the first and second transistors TS1 and TS2, and configured to output the first current I1. Further, the third terminal of the second transistor TS2 can be configured to output the second current I2.

The bandgap core circuit 204 can be coupled with the first current mirror circuit 202, and configured to receive the first and second currents I1 and I2. The bandgap core circuit 204 can be further coupled with the fifth feedback circuitry 502, and configured to receive the bandgap reference voltage VBG and a fifteenth current I15. Based on the first, second, and fifteenth currents I1, I2, and I15 and the bandgap reference voltage VBG, the bandgap core circuit 204 can be further configured to output tenth and eleventh control voltages VC10 and VC11.

The bandgap core circuit 204 can include the third and fourth transistors TS3 and TS4, and the first and second resistors R1 and R2. The first terminals of the third and fourth transistors TS3 and TS4 can be coupled with the third terminals of the first and second transistors TS1 and TS2, and configured to receive the first and second currents I1 and I2, respectively. The first terminals of the third and fourth transistors TS3 and TS4 can be further configured to output the tenth and eleventh control voltages VC10 and VC11, respectively. The second terminals of the third and fourth transistors TS3 and TS4 can be coupled with the fifth feedback circuitry 502, and configured to receive the bandgap reference voltage VBG.

The first and second terminals of the first resistor R1 can be coupled with the third terminals of the third and fourth transistors TS3 and TS4, and configured to receive the first and second currents I1 and I2, respectively. Further, the second terminal of the first resistor R1 can be coupled with the fifth feedback circuitry 502, and configured to receive the fifteenth current I15. Thus, the second terminal of the first resistor R1 can receive the first, second, and fifteenth currents I1, I2, and I15. The tenth control voltage VC10 can thus be outputted based on the first and fifteenth currents I1 and I15 and the bandgap reference voltage VBG. Similarly, the eleventh control voltage VC11 can be outputted based on the second and fifteenth currents I2 and I15 and the bandgap reference voltage VBG.

The first terminal of the second resistor R2 can be coupled with the second terminal of the first resistor R1, and configured to receive a sixteenth current I16 and generate a fourth intermediate voltage VI4. The fourteenth current I14 is equal to a sum of the first, second, and fifteenth currents I1, I2, and I15. The second terminal of the second resistor R2 can be coupled with the ground terminal. The bandgap reference voltage VBG is equal to a sum of the second base-emitter voltage Vbe2 of the fourth transistor TS4 and the fourth intermediate voltage VI4.

The amplifier 206 can be coupled with the first terminals of the third and fourth transistors TS3 and TS4, and the fifth feedback circuitry 502. The amplifier 206 can be configured to receive the tenth and eleventh control voltages VC10 and VC11 from the first terminals of the third and fourth transistors TS3 and TS4, respectively. In an embodiment, the amplifier 206 receives the tenth and eleventh control voltages VC10 and VC11 at positive and negative input terminals thereof, respectively. The amplifier 206 can be further configured to generate a twelfth control voltage VC12 based on the tenth and eleventh control voltages VC10 and VC11, and provide the twelfth control voltage VC12 to the fifth feedback circuitry 502. The twelfth control voltage VC12 can be generated such that the twelfth control voltage VC12 can be greater than a difference between the tenth and eleventh control voltages VC10 and VC11.

The fifth feedback circuitry 502 can be coupled with the power supply 102, and configured to receive the supply voltage VDD. The fifth feedback circuitry 502 can be further coupled with the amplifier 206, and configured to receive the twelfth control voltage VC12. Based on the supply voltage VDD and the twelfth control voltage VC12, the fifth feedback circuitry 502 can be further configured to generate the bandgap reference voltage VBG and the fifteenth current I15. The fifth feedback circuitry 502 can be further coupled with the bandgap core circuit 204, and further configured to provide the bandgap reference voltage VBG and the fifteenth current I15 to the bandgap core circuit 204. Further, the fifth feedback circuitry 502 can be coupled with the functional circuit 106, and configured to provide the bandgap reference voltage VBG to the functional circuit 106. The fifth feedback circuitry 502 can include thirteenth through sixteenth transistors TS12-TS15 and a sixth resistor R6.

The sixth resistor R6 has a first terminal that can be configured to receive a seventeenth current I17, and generate the bandgap reference voltage VBG. The first terminal of the sixth resistor R6 can be further coupled with the second terminals of the third and fourth transistors TS3 and TS4, and configured to provide the bandgap reference voltage VBG to the second terminals of the third and fourth transistors TS3 and TS4. In other words, the second terminals of the third and fourth transistors TS3 and TS4 can be configured to receive the bandgap reference voltage VBG from the first terminal of the sixth resistor R6. The first terminal of the sixth resistor R6 can be further coupled with the functional circuit 106, and configured to provide the bandgap reference voltage VBG to the functional circuit 106. The sixth resistor R6 further has a second terminal that can be coupled with the bandgap core circuit 204 (i.e., the second terminal of the first resistor R1), and configured to generate and provide the fifteenth current I15 to the second terminal of the first resistor R1. In one embodiment, the fifteenth and seventeenth currents I15 and I17 are equal.

The thirteenth transistor TS13 has first through third terminals. The first terminal of the thirteenth transistor TS13 can be coupled with the power supply 102, and configured to receive the supply voltage VDD. Further, the second terminal of the thirteenth transistor TS13 can be coupled with the first current mirror circuit 202 (i.e., the second terminals of the first and second transistors TS1 and TS2), and the third terminal of the thirteenth transistor TS13 can be configured to output an eighteenth current I18. In an embodiment, the thirteenth transistor TS13 is a PMOS transistor, and the first through third terminals of the thirteenth transistor TS13 correspond to source, gate, and drain terminals, respectively.

The first terminals (i.e., the source terminals) of the first and thirteenth transistors TS1 and TS13 are at a same voltage level (i.e., the supply voltage VDD). Similarly, the second terminals (i.e., the gate terminals) of the first and thirteenth transistors TS1 and TS13 are at a same voltage level. Thus, the first and thirteenth transistors TS1 and TS13 form a third current replica circuit (not shown). Further, sizes of the first and thirteenth transistors TS1 and TS13 are unequal. Hence, the first and eighteenth currents I1 and I18 are unequal. In one embodiment, the eighteenth current I18 is a scaled down version of the first current I1.

The fourteenth transistor TS14 has first through third terminals. The first terminal of the fourteenth transistor TS14 can be coupled with the ground terminal. Further, the third terminal of the fourteenth transistor TS14 can be coupled with the third terminal of the thirteenth transistor TS13, and configured to receive the eighteenth current I18. In an embodiment, the fourteenth transistor TS14 is an NMOS transistor, and the first through third terminals of the fourteenth transistor TS14 correspond to source, gate, and drain terminals, respectively.

The fifteenth transistor TS15 has first through third terminals. The first terminal of the fifteenth transistor TS15 can be coupled with the ground terminal, and the second terminal of the fifteenth transistor TS15 can be coupled with the second terminal of the fourteenth transistor TS14. The third terminal of the fifteenth transistor TS15 can be coupled with the first terminal of the sixth resistor R6, and configured to output a nineteenth current I19 such that the nineteenth current I19 is sank from the first terminal of the sixth resistor R6. In an embodiment, the fifteenth transistor TS15 is an NMOS transistor, and the first through third terminals of the fifteenth transistor TS15 correspond to source, gate, and drain terminals, respectively. For the sake of ongoing discussion, it is assumed that the nineteenth current I19 is equal to the eighteenth current I18. However, it will be apparent to a person skilled in the art that the scope of the present disclosure is not limited to the nineteenth current I19 being equal to the eighteenth current I18. In various other embodiments, the nineteenth current I19 can be a scaled down version of the eighteenth current I18, without deviating from the scope of the present disclosure.

The sixteenth transistor TS16 has a first terminal that can be coupled with the power supply 102, and configured to receive the supply voltage VDD. The sixteenth transistor TS16 further has a second terminal that can be coupled with the amplifier 206, and configured to receive the twelfth control voltage VC12. In other words, the amplifier 206 can be coupled with the second terminal of the sixteenth transistor TS16, and configured to provide the twelfth control voltage VC12 to the second terminal of the sixteenth transistor TS16. The sixteenth transistor TS16 further has a third terminal that can be coupled with the third terminal of the fifteenth transistor TS15 and the first terminal of the sixth resistor R6, and configured to output a twentieth current I20. In an embodiment, the sixteenth transistor TS16 is a PMOS transistor, and the first through third terminals of the sixteenth transistor TS16 correspond to source, gate, and drain terminals, respectively.

The twentieth current I20 can be thus outputted based on the supply voltage VDD and the twelfth control voltage VC12. The third terminal of the sixteenth transistor TS16 can output the twentieth current I20 such that the twentieth current I20 is sourced to the first terminal of the sixth resistor R6. The seventeenth current I17 received by the first terminal of the sixth resistor R6 can thus be generated based on the nineteenth and twentieth currents I19 and I20. In other words, the seventeenth current I17 is equal to a difference between the nineteenth and twentieth currents I19 and I20.

As the fifteenth current I15 is sourced to the bandgap core circuit 204 (i.e., the second terminal of the first resistor R1), a current passing through the second resistor R2 (i.e., the sixteenth current I16) increases, thereby increasing the fourth intermediate voltage VI4. As illustrated in FIG. 5A, the bandgap reference voltage VBG is equal to a sum of the second base-emitter voltage Vbe2 of the fourth transistor TS4 and the fourth intermediate voltage VI4. Hence, as the fourth intermediate voltage VI4 increases, the bandgap reference voltage VBG increases and is greater than the threshold value (i.e., the bandgap reference voltage at 0 K). Further, the utilization of the thirteenth through fifteenth transistors TS13-TS15 in the fifth feedback circuitry 502 can result in the bandgap reference voltage VBG generated by the bandgap reference voltage generator 104 of FIG. 5A being temperature-independent.

Figure 5B:
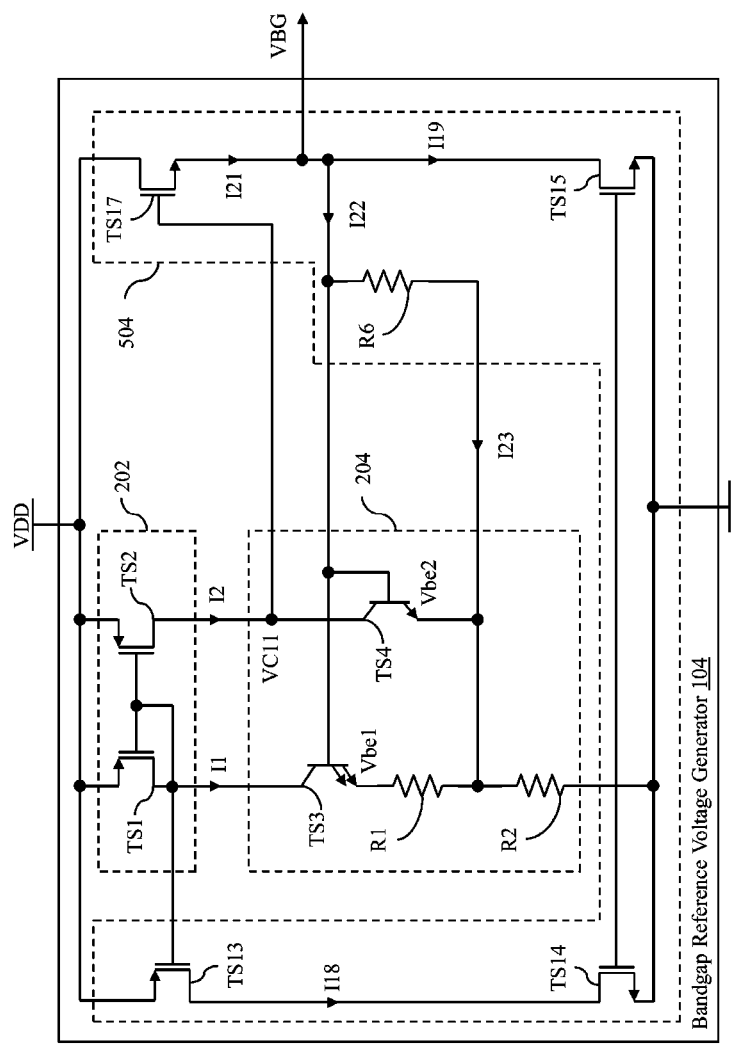
FIG. 5B illustrates a schematic circuit diagram of the bandgap reference voltage generator in accordance with yet another embodiment of the present disclosure.

FIG. 5B illustrates a schematic circuit diagram of the bandgap reference voltage generator 104 in accordance with yet another embodiment of the present disclosure. The bandgap reference voltage generator 104 can include the first current mirror circuit 202, the bandgap core circuit 204, and sixth feedback circuitry 504.

The structure and functionalities of the first current mirror circuit 202 and the bandgap core circuit 204 remain same as described in FIG. 5A. The difference between the embodiments of FIG. 5A and FIG. 5B is in the absence of the amplifier 206. As illustrated in FIG. 5B, the sixth feedback circuitry 504 (i.e., the second terminal of the sixteenth transistor TS16) receives the eleventh control voltage VC11, as compared to the twelfth control voltage VC12 as described in FIG. 5A. In other words, the first terminal of the fourth transistor TS4 is directly coupled with the second terminal of the sixteenth transistor TS16, and configured to provide the eleventh control voltage VC11 to the second terminal of the sixteenth transistor TS16.

The sixth feedback circuitry 504 is functionally similar to the fifth feedback circuitry 502. The difference between the fifth and sixth feedback circuitries 502 and 504 is that the PMOS transistor of the fifth feedback circuitry 502 (i.e., the sixteenth transistor TS16) is replaced by an NMOS transistor (i.e., a seventeenth transistor TS17) in the sixth feedback circuitry 504. The seventeenth transistor TS17 can be configured to output a twenty-first current I21 based on the supply voltage VDD and the eleventh control voltage VC11. The first terminal of the sixth resistor R6 can then receive a twenty-second current I22 that is outputted based on the nineteenth and twenty-first currents I19 and I21 (i.e., is equal to a difference between the nineteenth and twenty-first currents I19 and I21). Further, the first and second terminals of the sixth resistor R6 can then be configured to generate the bandgap reference voltage VBG and a twenty-third current I23, respectively, based on the twenty-second current I22 in a similar manner as described above in FIG. 5A. The bandgap reference voltage VBG and the twenty-third current I23 can then be provided to the bandgap core circuit 204 to facilitate the generation of the eleventh control voltage VC11.

Thus, the bandgap reference voltage generator 104 of the present disclosure generates the bandgap reference voltage VBG having a voltage level that can be greater than or less than a bandgap reference voltage at 0 K. Such a bandgap reference voltage VBG is generated by utilizing exclusively feedback circuitry (such as the first through sixth feedback circuitries 208, 302, 402, 404, 502, and 504) and sans any additional circuits (i.e., circuits that are not included in the feedback loop with the bandgap core circuit 204 and the first current mirror circuit 202). As a result, generation of significant base currents in bipolar transistors of the bandgap core circuit 204 (i.e., the third and fourth transistors TS3 and TS4) is eliminated, thereby eliminating a need to implement current compensation circuits in the bandgap reference voltage generator 104. Thus, a power supply rejection ratio of the bandgap reference voltage generator 104 of the present disclosure is greater than that of a conventional bandgap reference voltage generator that has significant base currents being generated in bipolar transistors of a corresponding bandgap core circuit, and hence, is required to implement various current compensation circuits therein. Further, a size and a manufacturing cost of the bandgap reference voltage generator 104 are significantly less than that of the conventional bandgap reference voltage generator. Additionally, a power consumed by the bandgap reference voltage generator 104 is significantly less than that consumed by the conventional bandgap reference voltage generator.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A bandgap reference voltage generator, comprising:
a bandgap core circuit that is configured to output first and second control voltages; and
feedback circuitry coupled with the bandgap core circuit, the feedback circuitry comprising:
a current replica circuit that is coupled with the bandgap core circuit, and configured to receive a supply voltage and a third control voltage that is generated based on the first and second control voltages, and output first and second currents, wherein the current replica circuit outputs the second current such that the second current is sourced to the bandgap core circuit, and wherein the bandgap core circuit outputs the first and second control voltages based on the second current; and
a first resistor that is coupled with the current replica circuit, and configured to
receive the first current and generate a bandgap reference voltage;
wherein the bandgap core circuit includes:
first and second transistors each having first through third terminals, wherein the first terminals of the first and second transistors are configured to receive third and fourth currents, and output the first and second control voltages, respectively, and the second terminals of the first and second transistors are coupled with the first resistor, and configured to receive the bandgap reference voltage, and wherein a size of the first transistor is greater than a size of the second transistor;
a second resistor that is coupled with the third terminals of the first and second transistors, and configured to receive the third and fourth currents, respectively; and
a third resistor that is coupled between the second resistor and a ground terminal, and configured to receive a fifth current and generate an intermediate voltage.

2. The bandgap reference voltage generator of claim 1, wherein:
the bandgap reference voltage is equal to a sum of the intermediate voltage and a base-emitter voltage associated with the second transistor,
the current replica circuit is coupled with the second resistor, and outputs the second current such that the second current is sourced to the second resistor,
the first terminals of the first and second transistors further output the first and second control voltages based on the second current, and
the fifth current is equal to a sum of the second through fourth currents.

3. The bandgap reference voltage generator of claim 1, further comprising a current mirror circuit that is configured to receive the supply voltage and output the third and fourth currents.

4. The bandgap reference voltage generator of claim 1, wherein the current replica circuit includes third and fourth transistors having (i) first terminals that are configured to receive the supply voltage, (ii) second terminals that are configured to receive the third control voltage, and (iii) third terminals that are configured to output the first and second currents, respectively, and wherein the third terminal of the second transistor is coupled with the second resistor, and outputs the second current such that the second current is sourced to the second resistor.

5. The bandgap reference voltage generator of claim 4, further comprising an amplifier that is coupled with the first terminals of the first and second transistors and the second terminals of the third and fourth transistors, and configured to receive the first and second control voltages from the first terminals of the first and second transistors, respectively, and generate and provide the third control voltage to the second terminals of the third and fourth transistors, wherein the third control voltage is greater than a difference between the first and second control voltages.

6. A bandgap reference voltage generator, comprising:
a bandgap core circuit that is configured to output first and second control voltages; and
feedback circuitry coupled with the bandgap core circuit, the feedback circuitry comprising:
a current replica circuit that is configured to receive a supply voltage and a third control voltage that is generated based on the first and second control voltages, and output first and second currents;

a first current mirror circuit that is coupled with the current replica circuit and the bandgap core circuit, and configured to receive the second current and output a third current such that the third current is sank from the bandgap core circuit, wherein the bandgap core circuit outputs the first and second control voltages based on the third current; and a first resistor that is coupled with the current replica circuit, and configured to receive the first current and generate a bandgap reference voltage.

7. The bandgap reference voltage generator of claim 6, wherein the bandgap core circuit includes:

first and second transistors each having first through third terminals, wherein the first terminals of the first and second transistors are configured to receive fourth and fifth currents, and output the first and second control voltages, respectively, and the second terminals of the first and second transistors are coupled with the first resistor, and configured to receive the bandgap reference voltage, and wherein a size of the first transistor is greater than a size of the second transistor;

a second resistor that is coupled with the third terminals of the first and second transistors, and configured to receive the fourth and fifth currents, respectively; and a third resistor that is coupled between the second resistor and a ground terminal, and configured to receive a sixth current and generate an intermediate voltage.

8. The bandgap reference voltage generator of claim 7, wherein:

the bandgap reference voltage is equal to a sum of the intermediate voltage and a base-emitter voltage associated with the second transistor, the first current mirror circuit is coupled with the second resistor, and outputs the third current such that the third current is sank from the second resistor, the first terminals of the first and second transistors further output the first and second control voltages based on the third current, and the sixth current is equal to a difference between the third current and a sum of the fourth and fifth currents.

9. The bandgap reference voltage generator of claim 7, further comprising a second current mirror circuit that is configured to receive the supply voltage and output the fourth and fifth currents.

10. The bandgap reference voltage generator of claim 7, wherein the current replica circuit includes third and fourth transistors having (i) first terminals that are configured to receive the supply voltage, (ii) second terminals that are configured to receive the third control voltage, and (iii) third terminals that are configured to output the first and second currents, respectively.

11. The bandgap reference voltage generator of claim 10, further comprising an amplifier that is coupled with the first terminals of the first and second transistors and the second terminals of the third and fourth transistors, and configured to receive the first and second control voltages from the first terminals of the first and second transistors, respectively, and generate and provide the third control voltage to the second terminals of the third and fourth transistors, wherein the third control voltage is greater than a difference between the first and second control voltages.

12. The bandgap reference voltage generator of claim 10, wherein the first current mirror circuit includes fifth and sixth transistors that have first terminals coupled with the ground terminal and second terminals coupled with each other, wherein the fifth transistor further has a third terminal that is coupled with the second terminals of the fifth and sixth transistors and the third terminal of the fourth transistor, and configured to receive the second current, and wherein the sixth transistor further has a third terminal that is coupled with the second resistor, and configured to output the third current such that the third current is sank from the second resistor.

13. A bandgap reference voltage generator, comprising:

a bandgap core circuit that is configured to output a first control voltage; and feedback circuitry coupled with the bandgap core circuit, the feedback circuitry comprising:

a first transistor that has (i) a first terminal configured to receive a supply voltage, (ii) a second terminal configured to receive one of the first control voltage and a second control voltage, and (iii) a third terminal configured to output a first current, wherein the second control voltage is generated based on the first control voltage; and a first resistor that is coupled with the bandgap core circuit and the third terminal of the first transistor, and configured to receive one of the first current and a second current that is generated based on the first current, and generate a bandgap reference voltage;

wherein the bandgap core circuit includes:

second and third transistors each having first through third terminals, wherein the first terminals of the second and third transistors are configured to receive third and fourth currents, respectively, and the second terminals of the second and third transistors are coupled with the first resistor, and configured to receive the bandgap reference voltage, and wherein a size of the second transistor is greater than a size of the third transistor;

a second resistor that is coupled with the third terminals of the second and third transistors, and configured to receive the third and fourth currents, respectively, wherein the second resistor is further coupled with the first resistor, and configured to receive a fifth current, and wherein the first terminal of the third transistor is further configured to output the first control voltage based on the fourth and fifth currents; and a third resistor that is coupled between the second resistor and a ground terminal, and configured to receive a sixth current and generate an intermediate voltage, wherein the sixth current is equal to a sum of the third through fifth currents.

14. The bandgap reference voltage generator of claim 13, wherein the bandgap reference voltage is equal to a sum of the intermediate voltage and a base-emitter voltage associated with the third transistor.

15. The bandgap reference voltage generator of claim 13, wherein the feedback circuitry further includes:

a fourth transistor having first through third terminals, wherein the first terminal of the fourth transistor is configured to receive the supply voltage and the third terminal of the fourth transistor is configured to output a seventh current;

a fifth transistor having first through third terminals, wherein the first terminal of the fifth transistor is coupled with the ground terminal and the third terminal of the fifth transistor is coupled with the third terminal of the fourth transistor, and configured to receive the seventh current; and a sixth transistor that has (i) a first terminal coupled with the ground terminal, (ii) a second terminal coupled with the second terminal of the fifth transistor, and (iii) a third terminal coupled with the third terminal of the first transistor and the first resistor, and configured to output an eighth current such that the eighth current is sank from the first resistor, wherein the second current is equal to a difference between the first and eighth currents.

16. The bandgap reference voltage generator of claim 15, further comprising a current mirror circuit that is coupled with the second terminal of the fourth transistor, and configured to receive the supply voltage and output the third and fourth currents.

17. The bandgap reference voltage generator of claim 13, wherein the first terminal of the third transistor is further coupled with the second terminal of the first transistor, and further configured to provide the first control voltage to the second terminal of the first transistor, and wherein the first current is outputted based on the first control voltage.

18. The bandgap reference voltage generator of claim 13, further comprising an amplifier that is coupled with the first terminals of the second and third transistors and the second terminal of the first transistor, wherein:
- the first terminal of the second transistor is further configured to output a third control voltage based on the third and fifth currents,
- the amplifier is configured to receive the first and third control voltages from the first terminals of the third and second transistors, respectively, and generate and provide the second control voltage to the second terminal of the first transistor,
- the second control voltage is greater than a difference between the first and third control voltages, and
- the first current is outputted based on the second control voltage.

* * * * *